(12) United States Patent
Bulatowicz et al.

(10) Patent No.: US 8,159,220 B2
(45) Date of Patent: Apr. 17, 2012

(54) NUCLEAR MAGNETIC RESONANCE GYROSCOPE MECHANIZATION

(75) Inventors: Michael D. Bulatowicz, Canoga Park, CA (US); Michael S. Larsen, Woodland Hills, CA (US); Robert Griffith, Woodland Hills, CA (US)

(73) Assignee: Northrop Grumman Guidance and Electronics Company, Inc., Woodland Hills, CA (US)

( * ) Notice: Subject to any disclaimer, the term of this patent is extended or adjusted under 35 U.S.C. 154(b) by 446 days.

(21) Appl. No.: 12/534,641

(22) Filed: Aug. 3, 2009

(65) Prior Publication Data

US 2011/0025330 A1 Feb. 3, 2011

(51) Int. Cl.
*G01V 3/00* (2006.01)
(52) U.S. Cl. ......... 324/304; 324/305
(58) Field of Classification Search ........ 324/304, 324/305, 301, 300
See application file for complete search history.

(56) References Cited

U.S. PATENT DOCUMENTS

| | | | | |
|---|---|---|---|---|
| 4,414,535 A * | 11/1983 | Ferriss | | 341/111 |
| 4,430,616 A | 2/1984 | Grover | | |
| 4,544,891 A * | 10/1985 | Karwacki | | 324/304 |
| 7,239,135 B2 * | 7/2007 | Abbink et al. | | 324/304 |
| 7,282,910 B1 | 10/2007 | Kanegsberg | | |
| 7,728,587 B2 * | 6/2010 | Stewart et al. | | 324/304 |

FOREIGN PATENT DOCUMENTS

EP 1 847 846 A1 10/2007

OTHER PUBLICATIONS

Search Report for corresponding EP 10 00 8100, completed Oct. 22, 2010 by Adrian Dragomir of The Hague.

* cited by examiner

*Primary Examiner* — Louis Arana
(74) *Attorney, Agent, or Firm* — Tarolli, Sundheim, Covell & Tummino LLP

(57) ABSTRACT

One embodiment of the invention includes a nuclear magnetic resonance (NMR) gyroscope system. The system includes a gyro cell that is sealed to enclose an alkali metal vapor, a first gyromagnetic isotope, a second gyromagnetic isotope, and a third gyromagnetic isotope. The system also includes a magnetic field generator configured to generate a substantially uniform magnetic field that is provided through the gyro cell to cause the first, second, and third gyromagnetic isotopes to precess. The system further includes an angular rotation sensor configured to measure a rotation angle about a sensitive axis of the NMR gyroscope system based on measured precession angles of the first, second, and third gyromagnetic isotopes.

20 Claims, 3 Drawing Sheets

NUCLEAR MAGNETIC RESONANCE GYROSCOPE MECHANIZATION

TECHNICAL FIELD

The present invention relates generally to beam cell systems, and specifically to nuclear magnetic resonance gyroscope mechanization.

BACKGROUND

A typical nuclear magnetic resonance (NMR) gyroscope operates on the principle of sensing inertial angular rotation rate or angle about a sensitive axis based on a shift in the Larmor precession frequency or phase of one or two isotopes that possess nuclear magnetic moments. An NMR gyroscope ("gyro") system can include a gyro cell and a rotation sensor that includes, for example, a light source, a photodetector, and signal processing circuitry. As an example, the gyro cell can contain one or more alkali metal vapors, such as Rubidium, together with one or two gyromagnetic isotopes that are caused to precess in response to a magnetic field. The signal processing circuitry can extract the Larmor precession frequency and phase information of the one or two gyromagnetic isotopes. As a result, a rotation frequency about the sensitive axis can be calculated based on the extracted Larmor precession frequencies and phase information.

SUMMARY

One embodiment of the invention includes a nuclear magnetic resonance (NMR) gyroscope system. The system includes a gyro cell that is sealed to enclose an alkali metal vapor, a first gyromagnetic isotope, a second gyromagnetic isotope, and a third gyromagnetic isotope. The system also includes a magnetic field generator configured to generate a substantially uniform magnetic field that is provided through the gyro cell to cause the first, second, and third gyromagnetic isotopes to precess. The system further includes an angular rotation sensor configured to measure a rotation angle about a sensitive axis of the NMR gyroscope system based on measured precession angles of the first, second, and third gyromagnetic isotopes.

Another embodiment of the invention includes a method of determining a rotation angle about a sensitive axis in an NMR gyroscope system. The method includes providing an external substantially uniform magnetic field through the gyro cell to cause a first gyromagnetic isotope, a second gyromagnetic isotope, and a third gyromagnetic isotope within the gyro cell to precess. The method also includes measuring precession angles of two of the first, second, and third gyromagnetic isotope relative to a precession angle of a slowest precessing one of the first, second, and third gyromagnetic isotopes. The method further includes calculating a rotation angle about the sensitive axis of the NMR gyroscope system based on the measured precession angles of the two of the first, second, and third gyromagnetic isotopes.

Another embodiment of the invention includes an NMR gyroscope system. The system includes means for generating a substantially uniform magnetic field that is provided through a sealed gyro cell to cause a first gyromagnetic isotope, a second gyromagnetic isotope, and a third gyromagnetic isotope to precess. The system also includes means for measuring precession angles of the first, second, and third gyromagnetic isotopes. The system further includes means for calculating a rotation angle about a sensitive axis of the NMR gyroscope system independently of a time duration of a measurement period, a magnitude of the substantially uniform magnetic field, and a net local magnetic field resulting from polarization of the alkali metal vapor relative to the first, second, and third gyromagnetic isotopes based on the measured precession angles.

DETAILED DESCRIPTION

The present invention relates generally to beam cell systems, and specifically to nuclear magnetic resonance (NMR) gyroscope mechanization. An NMR gyro system can include a gyro cell that includes an alkali metal and three gyromagnetic isotopes that each precess in response to a substantially uniform magnetic field that is applied through the gyro cell. The gyromagnetic isotopes can be, for example, noble gas isotopes. As an example, a first of the gyromagnetic isotopes can precess in a first rotation direction and the other two gyromagnetic isotopes can precess in the opposite rotation direction. The NMR gyro system can also include an angular rotation sensor that is configured to measure precession angles of the gyromagnetic isotopes to calculate a rotation angle about a sensitive axis of the NMR gyro system based on a mechanization equation. As described herein, the sensitive axis of the NMR gyro system is an axis about which a photosensor arrangement of the NMR gyro system rotates relative to the precession of the gyromagnetic isotopes and an alkali metal vapor in a total net magnetic field.

As an example, the mechanization equation can be derived from precession angle equations for each of the respective gyromagnetic isotopes. The derivation of the mechanization equation can be such that the calculation of the rotation angle about the sensitive axis can be independent of a time duration of a measurement period, independent of the applied magnetic field that causes the precession, and independent of a local magnetic field within the gyro cell that is based on an interaction of the gyromagnetic isotopes with the alkali metal. Therefore, the rotation angle about the sensitive axis can be calculated based on the cancellation of unknown variables.

The time duration of the measurement period can be set as a predetermined precession angle of a slowest precessing one of the gyromagnetic isotopes, such that the precession angle of the other two gyromagnetic isotopes can be measured relative to the third. As a result, the measurement period is standardized for the three gyromagnetic isotopes. Provided that the time period is approximately equal for all three isotopes, the measurement time period can be cancelled out for all three isotopes in the mechanization equations. Therefore, based on the standardized measurement period for the three gyromagnetic isotopes, based on the cancellation of the time duration of the measurement period in the mechanization equation, and because the angular rotation sensor measures a rotation angle about the sensitive axis instead of a rotation frequency, the NMR gyro system need not rely on the accuracy of a local oscillator to provide an accurate rotation angle about the sensitive axis. Accordingly, the rotation angle about the sensitive axis can be substantially accurate based on a lack of dependence on stability of a frequency reference.

Figure 1:
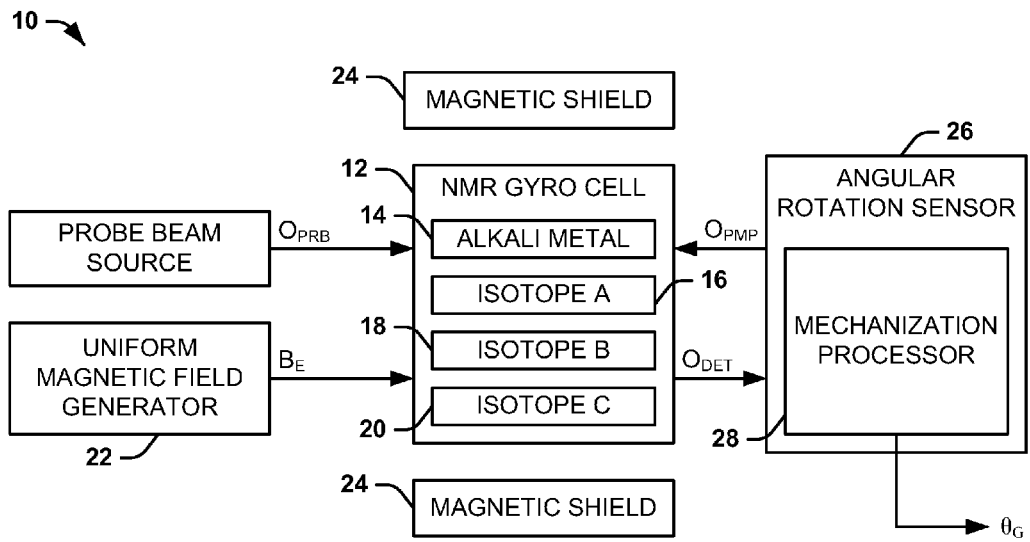
FIG. 1 illustrates an example of a nuclear magnetic resonance (NMR) gyro system in accordance with an aspect of the invention.

FIG. 1 illustrates an example of a nuclear magnetic resonance (NMR) gyro system 10 in accordance with an aspect of the invention. The NMR gyro system 10 can be implemented in any of a variety of applications. As an example, the NMR gyro system 10 can be implemented in navigation systems for aircraft and/or spacecraft. In addition, the NMR gyro system 10 can be a portion of a multi-axis gyro system, such as demonstrated in greater detail in the example of FIG. 3.

The NMR gyro system 10 includes an NMR gyro cell 12 that can be, for example, a glass casing of any of a variety of shapes and sizes. The NMR gyro cell 12 includes an alkali metal 14, as well as a first gyromagnetic isotope 16, a second gyromagnetic isotope 18, and a third gyromagnetic isotope 20, demonstrated in the example of FIG. 1 as ISOTOPE A, ISOTOPE B, and ISOTOPE C, respectively. As an example, the alkali metal 14 can be Rubidium (Rb) or Cesium (Cs) vapor, and the gyromagnetic isotopes 16, 18, and 20 can include noble gas isotopes such as Helium-3, Krypton-83, Xenon-129, and/or Xenon-131. The NMR gyro system 10 also includes a uniform magnetic field generator 22 that is configured to generate a substantially uniform magnetic field $B_E$ through the NMR gyro cell 12. As an example, the uniform magnetic field generator 22 can be configured as a magnetic solenoid that substantially surrounds the NMR gyro cell 12.

In response to the substantially uniform magnetic field $B_E$, the gyromagnetic isotopes 16, 18, and 20 precess relative to an axis of the NMR gyro cell 12. As an example, the gyromagnetic isotopes 16, 18, and 20 can be selected such that the first gyromagnetic isotope 16 precesses in a first rotation direction and the second and third gyromagnetic isotopes 18 and 20 precess in the opposite rotation direction. Each of the gyromagnetic isotopes 16, 18, and 20 can precess at a unique frequency relative to the other two of the gyromagnetic isotopes 16, 18, and 20 in response to the substantially uniform magnetic field $B_E$ and can also change precession frequencies by different amounts relative to changes in the substantially uniform magnetic field $B_E$. Therefore, the substantially uniform magnetic field $B_E$ can be controlled to maintain a substantially constant magnitude of the substantially uniform magnetic field $B_E$. In addition, the NMR gyro system 10 includes a magnetic shield 24 that can substantially surround the NMR gyro cell 12, thus substantially mitigating interference from external magnetic fields, such as from the magnetic field of Earth.

The NMR gyro system 10 further includes an angular rotation sensor 26. The angular rotation sensor 26 is configured to measure a precession angle of each of the gyromagnetic isotopes 16, 18, and 20 over a given time duration that defines a measurement period, and is configured to calculate a rotation angle $\theta_G$ about a sensitive axis of the NMR gyro cell 12 over the time duration based on the measured precession angles. Because the angular rotation sensor 26 is configured to measure the precession angles of the gyromagnetic isotopes 16, 18, and 20 instead of the precession frequencies of the gyromagnetic isotopes 16, 18, and 20, the angular rotation sensor 26 need not rely on a potentially inaccurate frequency reference from one measurement period to the next, as is inherently the case with measuring precession frequencies of gyromagnetic isotopes, such as in typical NMR gyro systems. In addition, the calculation of the rotation angle $\theta_G$ about the sensitive axis instead of a rotation frequency can reduce processing time and resources, and likewise mitigates reliance on a potentially inaccurate frequency reference.

As an example, the angular rotation sensor 26 can be configured to optically pump the alkali metal 14 in the NMR gyro cell 12 with an optical pump beam $O_{PMP}$ to align the spin of the alkali metal 14 with the substantially uniform magnetic field $B_E$. In response, due to a spin-exchange process, the gyromagnetic isotopes 16, 18, and 20 are also spin-aligned to the optical pump beam $O_{PMP}$. The NMR gyro system 10 also includes a probe beam source 27 that is configured to generate a probe beam $O_{PRB}$ that passes through the NMR gyro cell 12. The probe beam $O_{PRB}$ exits the NMR gyro cell 12 as a detection beam $O_{DET}$, such as with a directional component normal to the optical pump beam $O_{PMP}$. The alignment of the alkali metal 14 resulting from the optical pump beam $O_{PMP}$ can modulate the probe beam $O_{PRB}$ to generate the detection beam $O_{DET}$. Specifically, the modulation of the detection beam $O_{DET}$ can be a function of the precession of the alkali metal 14 as modified by the precession of the gyromagnetic isotopes 16, 18, and 20. As an example, the angular rotation sensor 26 can include one or more photodetectors configured to detect the modulation of the detection beam $O_{DET}$. Accordingly, changes in the precession angles of the alkali metal 14 and the gyromagnetic isotopes 16, 18, and 20, as detected in the modulated optical detection signal $O_{DET}$, can be processed to determine changes in the orientation about the sensitive axis that correspond to rotational motion.

As an example, the angular rotation sensor 26 can be configured to measure the precession angles of the gyromagnetic isotopes 16, 18, and 20 by setting the time duration of the measure time period as a predetermined precession angle of the slowest precessing one of the gyromagnetic isotopes 16, 18, and 20. Therefore, the precession angles of the other two of the gyromagnetic isotopes 16, 18, and 20 can be measured relative to the slowest precessing one of the gyromagnetic isotopes 16, 18, and 20. As a result, the measurement period for the precession angles of the gyromagnetic isotopes 16, 18, and 20 can be standardized to the slowest precessing one of the gyromagnetic isotopes 16, 18, and 20 instead of relying on a local oscillator. Furthermore, measuring the precession angle of only two of the three gyromagnetic isotopes 16, 18, and 20 can reduce signal processing time and resources to result in a faster measurement of the rotation angle $\theta_G$ about the sensitive axis.

In the example of FIG. 1, the angular rotation sensor 26 includes a mechanization processor 28. The mechanization processor 28 can be configured to calculate the rotation angle $\theta_G$ about the sensitive axis based on the measured precession angles of the gyromagnetic isotopes 16, 18, and 20. Specifically, the mechanization processor 28 can calculate a solution for the rotation angle $\theta_G$ about the sensitive axis from a mechanization equation that is derived from a set of precession angle equations based on the measured precession angles of the gyromagnetic isotopes 16, 18, and 20. Based on the derivation of the solution for the rotation angle $\theta_G$ about the sensitive axis using the three precession angle equations corresponding to the gyromagnetic isotopes 16, 18, and 20, respectively, variables for the time duration of the measurement period, the magnitude of the substantially uniform magnetic field $B_E$, and a local magnetic field within the gyro cell that is based on an interaction of the gyromagnetic isotopes with the alkali metal can all be cancelled from the solution. Accordingly, the measurement of the rotation angle $\theta_G$ about the sensitive axis can be substantially independent of the time duration of the measurement period, the magnitude of the substantially uniform magnetic field $B_E$, and the local magnetic field within the NMR gyro cell 12. Furthermore, based on the cancellation of the time duration of the measurement period, reliance on a potentially inaccurate frequency reference is mitigated from one measurement period to the next.

Figure 2:
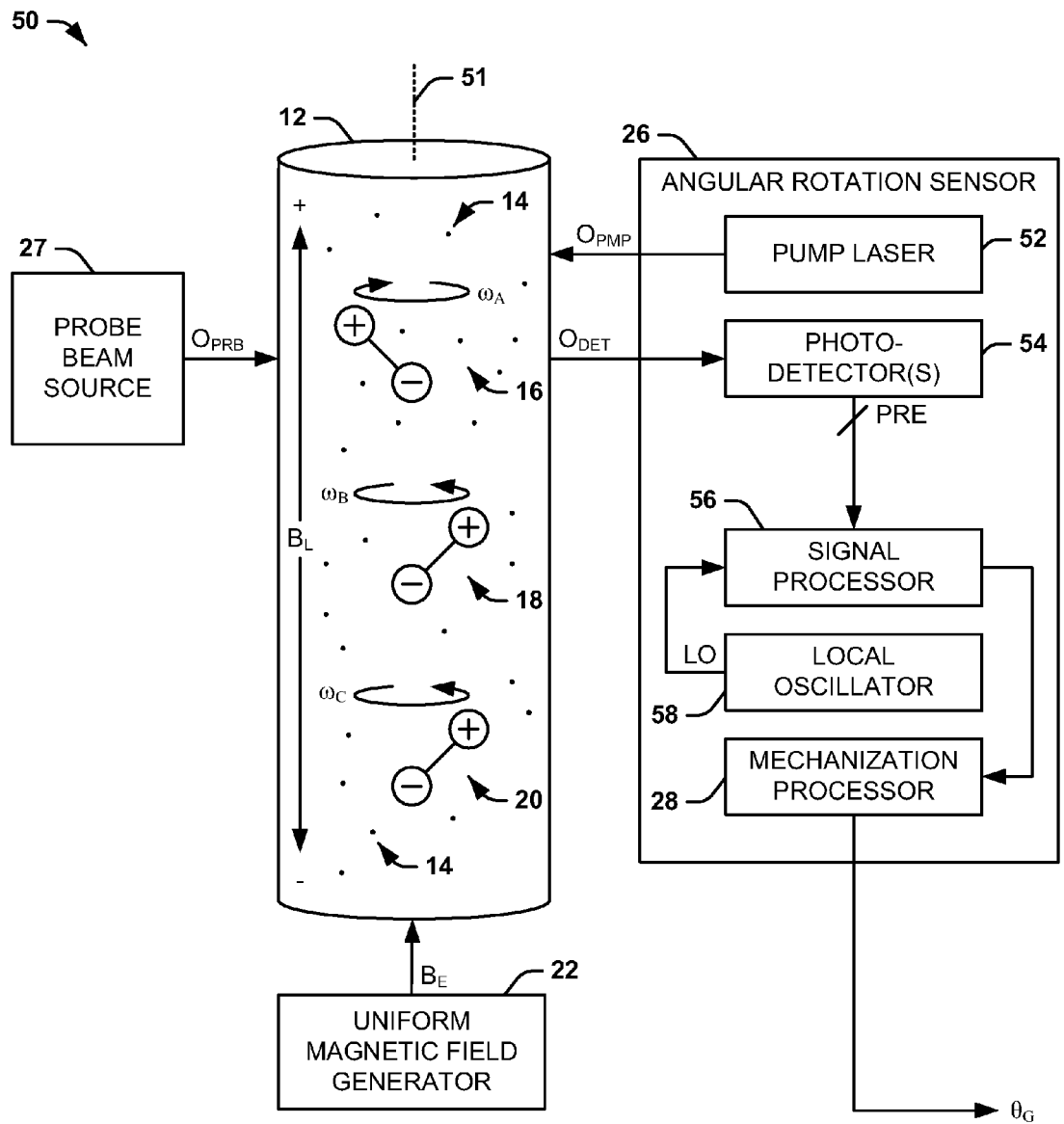
FIG. 2 illustrates another example of an NMR gyro system in accordance with an aspect of the invention.

FIG. 2 illustrates another example of an NMR gyro system 50 in accordance with an aspect of the invention. The NMR gyro system 50 can be configured substantially similar to the NMR gyro system 10 in the example of FIG. 1. Specifically, the NMR gyro system 50 can be configured to measure a rotation angle $\theta_G$ about a sensitive axis 51. Thus, the NMR gyro system 50 can be implemented in navigation systems for aircraft and/or spacecraft, and/or as part of a multi-axis gyro system, similar to as described in the example of FIG. 1 above. Therefore, like reference numbers are used in the example of FIG. 2 as those used in the example of FIG. 1.

The NMR gyro system 50 includes the NMR gyro cell 12. In the example of FIG. 2, the NMR gyro cell 12 is demonstrated as cylindrical. However, it is to be understood that the NMR gyro cell 12 can be any of a variety of shapes, such as cubical or spherical. The NMR gyro cell 12 includes the alkali metal 14, demonstrated in the example of FIG. 2 as a vapor residing within the NMR gyro cell 12. The NMR gyro cell 12 also includes the first gyromagnetic isotope 16, the second gyromagnetic isotope 18, and the third gyromagnetic isotope 20, demonstrated diagrammatically in the example of FIG. 2. The NMR gyro system 50 also includes the uniform magnetic field generator 22 that generates the substantially uniform magnetic field $B_E$ through the NMR gyro cell 12 in a direction that is substantially parallel with the sensitive axis 51. Similar to as described above in the example of FIG. 1, the uniform magnetic field generator 22 can be configured as a magnetic solenoid that substantially surrounds the NMR gyro cell 12.

In response to the substantially uniform magnetic field $B_E$, the gyromagnetic isotopes 16, 18, and 20 precess relative to a longitudinal axis of the NMR gyro cell 12. In the example of FIG. 2, the first gyromagnetic isotope 16 precesses in a clockwise direction relative to the top of the NMR gyro cell 12 at a frequency of $\omega_A$. The second and third gyromagnetic isotopes 18 and 20 each precess in a counter-clockwise direction relative to the top of the NMR gyro cell 12 at a frequency of $\omega_B$ and $\omega_C$, respectively. The frequencies $\omega_A$, $\omega_B$, and $\omega_C$ of precession can have individual and unequal magnitudes in response to the substantially uniform magnetic field $B_E$ and can change magnitudes by different amounts relative to changes in the substantially uniform magnetic field $B_E$. In addition, the NMR gyro system 50 includes the magnetic shield 24 that can substantially surround the NMR gyro cell 12, thus substantially mitigating interference from external magnetic fields, such as from the magnetic field of Earth.

In addition to the substantially uniform magnetic field $B_E$, the gyromagnetic isotopes 16, 18, and 20 are also subject to a local magnetic field $B_L$ within the NMR gyro cell 12. The local magnetic field $B_L$ can result from an interaction of the gyromagnetic isotopes 16, 18, and 20 with the alkali metal 14. Specifically, as described in greater detail below, the alkali metal 14 is optically pumped to align the alkali metal 14 and the precessing gyromagnetic isotopes 16, 18, and 20 with the substantially uniform magnetic field $B_E$ in a spin-exchange process. This spin-exchange process thus creates the local magnetic field $B_L$, as explained in greater detail below, that is substantially parallel with the substantially uniform magnetic field $B_E$, and thus the sensitive axis 51. As an example, the local magnetic field can have a direction that is the same or opposite the substantially uniform magnetic field $B_E$ depending on the polarization direction of the optical pump beam $O_{PMP}$. The local magnetic field $B_L$ can have a net effect on the precession frequencies $\omega_A$, $\omega_B$, and $\omega_C$ in different ways for each of the gyromagnetic isotopes 16, 18, and 20. Specifically, the mass of the gyromagnetic isotopes 16, 18, and 20 is determinative of the effect of the local magnetic field $B_L$ on each of the respective gyromagnetic isotopes 16, 18, and 20. The different masses of the gyromagnetic isotopes 16, 18, and 20 can cause a reduced mass shift in the coupling between the alkali metal particles 14 and the gyromagnetic isotopes 16, 18, and 20 while bound to each other in short lived molecules. Therefore, the gyromagnetic isotopes 16, 18, and 20 can experience different magnetic moments.

In addition to the effect of isotope mass of the gyromagnetic isotopes 16, 18, and 20, the character of the respective magnetic fields produced by the net spin (e.g., dipole, quadrupole, etc.) of the isotopes gyromagnetic isotopes 16, 18, and 20 plays a role in the net magnetic moment experienced by the respective gyromagnetic isotopes 16, 18, and 20. For example, $^{129}$Xe has a dipolar magnetic moment, while $^{131}$Xe has a quadrupolar magnetic moment. As a result, $^{129}$Xe experiences a magnetic moment that drops off with the cube of the distance from the nucleus, while $^{131}$Xe experiences a magnetic moment that drops off with the distance from the nucleus to the fourth power (i.e., distance$^4$).

The NMR gyro system 50 further includes the angular rotation sensor 26. The angular rotation sensor 26 includes a pump laser 52 that is configured to generate the optical pump beam $O_{PMP}$. As an example, the optical pump beam $O_{PMP}$ can be circularly polarized light. Although the example of FIG. 2 demonstrates that the optical pump beam $O_{PMP}$ is provided to the NMR gyro cell 12 at a transverse direction relative to the sensitive axis 51, it is to be understood that the optical pump beam $O_{PMP}$ can be provided at a variety of orientations, such as substantially parallel to the sensitive axis 51. The optical pump beam $O_{PMP}$ is provided to the NMR gyro cell 12 to optically pump the alkali metal 14 in the NMR gyro cell 12 to align the spin of the alkali metal 14 with the substantially uniform magnetic field $B_E$. In response, due to a spin-exchange process, the gyromagnetic isotopes 16, 18, and 20 are also spin-aligned to the optical pump beam $O_{PMP}$.

As an example, once pumped by the optical pump beam $O_{PMP}$, the atoms that constitute the alkali metal 14 may rapidly lose a respective electron polarization, thus becoming substantially randomly oriented. The random orientation can occur, for example, as a result of collisions with other atoms, collisions with atoms that are not aligned with the substantially uniform magnetic field $B_E$, and/or collisions with other atoms that are aligned with the substantially uniform magnetic field $B_E$, such as based on a Cs—Xe spin-exchange collision process. Therefore, once the alkali metal 14 reaches a specific state and energy level, the alkali metal 14 experiences a force aligning it to the substantially uniform magnetic field $B_E$. In the absence of any magnetic fields transverse to the sensitive axis 51, such as can be mitigated by the magnetic shield 24 (not shown in the example of FIG. 2), the spin exchange optically pumped gyromagnetic isotopes 16, 18, and 20, such as Xe, may not precess. However, a magnetic field transverse to the sensitive axis 51, such as based on a misalignment of the substantially uniform magnetic field $B_E$ and the local magnetic field $B_L$, can result in misalignment of the net DC and AC fields in the NMR gyro cell 12. As a result, a net torque can act on the spin of the gyromagnetic isotopes 16, 18, and 20 that, in the example of an oscillating transverse field, can be in resonance with a respective natural Larmor frequency, thus causing the gyromagnetic isotopes 16, 18, and 20 to precess in phase with each other. The magnitude of the torque on the electron spin of a fully pumped atom of the alkali metal 14 can be a function of the angle between a magnetic moment of the respective pumped atom and a magnitude of the substantially uniform magnetic field $B_E$.

Due to the magnitude of the substantially uniform magnetic field $B_E$, the Larmor precession period of one or more of the gyromagnetic isotopes 16, 18, and 20 can be long relative to a time that it takes for the atoms of the alkali metal 14 to return to a lower energy state at which they can be re-pumped by the optical pump beam $O_{PMP}$. Therefore, while the optical pump beam $O_{PMP}$ is substantially constantly causing atoms of the alkali metal 14 to become aligned with the substantially uniform magnetic field $B_E$, other previously-aligned atoms of the alkali metal 14 are falling out of alignment with the DC portion of the substantially uniform magnetic field $B_E$. The result of the net effect of the optical pumping of the very large number of atoms of the alkali metal 14 in the NMR gyro cell 12 is the generation of the local magnetic field $B_L$. The local magnetic field $B_L$ is demonstrated in the example of FIG. 2 as being substantially parallel to the substantially uniform magnetic field $B_E$. However, the local magnetic field $B_L$ can also have a second directional component that is substantially parallel to the optical pump beam $O_{PMP}$. As an example, the net magnitude and direction of the local magnetic field $B_L$ can be based on the magnitude of the substantially uniform magnetic field $B_E$, the atomic density of the alkali metal 14, and the characteristics of the optical pump beam $O_{PMP}$, such as direction, intensity, and wavelength (on or off resonance).

The NMR gyro system 50 also includes the probe beam source 27 that generates the probe beam $O_{PRB}$. In the example of FIG. 2, the probe beam $O_{PRB}$ passes through the NMR gyro cell 12 at a direction that is perpendicular to the direction of the substantially uniform magnetic field $B_E$. The probe beam $O_{PRB}$ exits the NMR gyro cell 12 as the detection beam $O_{DET}$. The alignment of the alkali metal 14 resulting from the optical pump beam $O_{PMP}$ can modulate the probe beam $O_{PRB}$ to generate the detection beam $O_{DET}$. Specifically, the spin-alignment and precession of the gyromagnetic isotopes 16, 18, and 20 results in modulation of the precession of the alkali metal 14, which in turn modulates the optical probe beam $O_{PRB}$ to generate the optical detection beam $O_{DET}$, such that the modulation of the detection beam $O_{DET}$ corresponds to the precession of the gyromagnetic isotopes 16, 18, and 20.

The optical detection beam $O_{DET}$ is provided to one or more photodetectors 54 in the angular rotation sensor 26. The photodetector(s) 54 is configured to detect and demodulate the optical detection beam $O_{DET}$. The photodetector(s) 54 is thus configured to generate a set of signals PRE that each correspond to the precession frequencies $\omega_A$, $\omega_B$, and $\omega_C$ of the respective gyromagnetic isotopes 16, 18, and 20. As an example, the optical detection beam $O_{DET}$ can be demodulated and filtered to generate the signals PRE as separate functions, such as Bessel functions, that each has a period corresponding to a complete 360 degree rotation of the respective one of the gyromagnetic isotopes 16, 18, and 20. The signals PRE are provided to a signal processor 56 that is configured to define the time duration of the measurement period and to measure the precession angles $\theta_A$, $\theta_B$, and $\theta_C$ of the gyromagnetic isotopes 16, 18, and 20 based on the respective signals PRE over the time duration.

The signal processor 56 can define measurable conditions of the signals PRE as measurement pulses that correspond to complete rotations or portions of a complete rotation of the respective gyromagnetic isotopes 16, 18, and 20. For example, the signal processor 56 can be configured to set the measurement pulses as rising-edge zero crossings of each of the signals PRE, thus each measurement pulse can correspond to a complete 360 degree rotation of the respective one of the gyromagnetic isotopes 16, 18, and 20. As another example, the signal processor 56 can be configured to set the measurement pulses as any zero crossing of each of the signals PRE, thus each measurement pulse can correspond to a 180 degree rotation of the respective one of the gyromagnetic isotopes 16, 18, and 20. As yet another example, the signal processor 56 can be configured to set the measurement pulses as any zero crossing or any zero value of a first derivative of each of the signals PRE, thus each measurement pulse can correspond to a 90 degree rotation of the respective one of the gyromagnetic isotopes 16, 18, and 20.

As an example, the signal processor can be configured to set the time duration of the measure time period as a predetermined precession angle of the slowest precessing one of the gyromagnetic isotopes 16, 18, and 20, as indicated by the signals PRE. Specifically, the signal processor 56 can set the time duration of the measurement period as a predetermined number of measurement pulses, thus corresponding to the predetermined precession angle, of the slowest precessing one of the gyromagnetic isotopes 16, 18, and 20. Therefore, the precession angles of the other two of the gyromagnetic isotopes 16, 18, and 20 can be measured relative to the slowest precessing one of the gyromagnetic isotopes 16, 18, and 20. As a result of the signal processor 56 measuring only two of the three of the gyromagnetic isotopes 16, 18, and 20, processing and calculation of the precession angles $\theta_A$, $\theta_B$, and $\theta_C$ of the gyromagnetic isotopes 16, 18, and 20 can be greatly simplified.

The angular rotation sensor 26 includes a local oscillator 58 that generates a local oscillator signal LO that can provide a frequency reference for each individual measurement period. As an example, the signal processor 56 can be configured to count a number of pulses of the local oscillator signal LO between each measurement pulse of the gyromagnetic isotopes 16, 18, and 20 during the measurement period. Therefore, the precession angle of the other two (i.e., the non-slowest precessing) gyromagnetic isotopes 16, 18, and 20 can be measured relative to the predetermined precession angle that is precessed by the slowest precessing one of the gyromagnetic isotopes 16, 18, and 20.

As an example, the first gyromagnetic isotope 16 can be the slowest precessing of the gyromagnetic isotopes 16, 18, and 20. The signal processor 56 can thus set the predetermined precession angle at 360 degrees of the first gyromagnetic isotope 16. During the measurement period, the signal processor 56 counts 100 pulses of the local oscillator signal LO. Also during the measurement period, the signal processor 56 counts one full rotation (i.e., 360 degrees) of the second gyromagnetic isotope 18, and counts that 80 pulses of the local oscillator signal LO occurred during the one full rotation. In addition, the signal processor 56 counts two full rotations of the third gyromagnetic isotope 20, and counts that 43 pulses of the local oscillator signal LO occurred during each full rotation. Therefore, the signal processor determines that, during the measurement period, the gyromagnetic isotopes 16, 18, and 20 have respective precession angles $\theta_A$, $\theta_B$, and $\theta_C$ during the measurement period as follows:

$\theta_A$=1 full rotation=360 degrees (as predetermined by the signal processor 56);

$\theta_B$=(1+(100−80)/80)=1.25 full rotations=450 degrees; and $\theta_C$=(2+(100−(2*43))/43)=2.3255814 full rotations=837.209302 degrees.

Based on the measurement of the precession angles $\theta_A$, $\theta_B$, and $\theta_C$, and not measurement of the precession frequencies $\omega_A$, $\omega_B$, and $\omega_C$, and based on the measurement time period being set based on the slowest precessing one of the gyromagnetic isotopes 16, 18, and 20, the signal processor 56 need only rely on the accuracy of the frequency reference that is provided by the local oscillator signal LO through the duration of each measurement period. Therefore, the measurement of the precession angles $\theta_A$, $\theta_B$, and $\theta_C$ of the respective gyromagnetic isotopes 16, 18, and 20, and thus the rotation angle $\theta_G$ about the sensitive axis, is substantially independent of accuracy of the frequency reference that is provided by the local oscillator signal LO from one measurement period to the next. Specifically, the local oscillator 58 need only maintain accuracy of the frequency reference that is provided by the local oscillator signal LO through the time duration of each measurement period, which can be very short (e.g., 0.001 second or shorter). Thus, the frequency reference that is provided by the local oscillator signal LO can vary in accuracy between measurement periods and still provide an accurate frequency reference for calculation of the rotation angle $\theta_G$ about the sensitive axis.

The measured precession angles $\theta_A$, $\theta_B$, and $\theta_C$ of the respective gyromagnetic isotopes 16, 18, and 20 are provided to the mechanization processor 28. The mechanization processor 28 is configured to calculate the rotation angle $\theta_G$ about the sensitive axis 51 based on a mechanization equation that is derived from a set of precession angle equations for each of the respective gyromagnetic isotopes 16, 18, and 20. Specifically, the precession angles $\theta_A$, $\theta_B$, and $\theta_C$ of the respective gyromagnetic isotopes 16, 18, and 20 can be expressed as follows:

$$\theta_A = (\gamma E_A * B_E + \gamma P_A * B_L) * t + \theta_G \quad \text{Equation 1}$$

$$\theta_B = (\gamma E_B * B_E + \gamma P_B * B_L) * t - \theta_G \quad \text{Equation 2}$$

$$\theta_C = (\gamma E_C * B_E + \gamma P_C * B_L) * t - \theta_G \quad \text{Equation 3}$$

Where: $\gamma E_X$ is the gyromagnetic ratio for the respective one of the gyromagnetic isotopes 16, 18, and 20 for precession in response to the substantially uniform magnetic field $B_E$;

$\gamma P_X$ is the coupling constant of the respective one of the gyromagnetic isotopes 16, 18, and 20 with the alkali metal 14 for precession in response to the local magnetic field $B_L$; and t is the time duration of the measurement period.

Based on the above equations for precession angles $\theta_A$, $\theta_B$, and $\theta_C$ of the respective gyromagnetic isotopes 16, 18, and 20, the following equation can be derived for the rotation angle $\theta_G$ about the sensitive axis 51:

$$\theta_G = \theta_A - \gamma E a * \frac{\theta_A + \theta_B + (\theta_C - \theta_B) * \frac{\gamma_{Pa} + \gamma_{Pb}}{\gamma_{Pa} - \gamma_{Pb}}}{\gamma_{Ea} + \gamma_{Eb} + \frac{\gamma_{Ec} - \gamma_{Eb}}{\gamma_{Pb} - \gamma_{Pc}} * (\gamma_{Pa} + \gamma_{Pb})} + \quad \text{Equation 4}$$

$$\gamma P a * \left( \frac{(\theta_B - \theta_C)}{\gamma_{Pb} - \gamma_{Pc}} + \frac{\theta_A + \theta_B + (\theta_C - \theta_B) * \frac{\gamma_{Pa} + \gamma_{Pb}}{\gamma_{Pa} - \gamma_{Pb}}}{\gamma_{Ea} + \gamma_{Eb} + \frac{\gamma_{Ec} - \gamma_{Eb}}{\gamma_{Pb} - \gamma_{Pc}} * (\gamma_{Pa} + \gamma_{Pb})} \right) *$$

$$\frac{\gamma_{Ec} - \gamma_{Eb}}{\gamma_{Pb} - \gamma_{Pc}}$$

The mechanization processor 28 can thus calculate the rotation angle $\theta_G$ about the sensitive axis 51 based on the measured precession angles $\theta_A$, $\theta_B$, and $\theta_C$ of the respective gyromagnetic isotopes 16, 18, and 20 using Equation 4.

As demonstrated in Equation 4, the derivation of the rotation angle $\theta_G$ about the sensitive axis 51 from Equations 1 through 3 results in a cancellation of the magnitude of the substantially uniform magnetic field $B_E$, the magnitude of the local magnetic field $B_L$, and the time duration t. Therefore, the rotation angle $\theta_G$ about the sensitive axis 51 can be calculated independently of the substantially uniform magnetic field $B_E$, the local magnetic field $B_L$, and the time duration t of the measurement period. Thus, based on the cancellation of the time duration of the measurement period, and based on measurement of the precession angles $\theta_A$, $\theta_B$, and $\theta_C$ of the respective gyromagnetic isotopes 16, 18, and 20 as well as the resultant calculation of the rotation angle $\theta_G$ about the sensitive axis 51, the mechanization processor need not rely on a potentially inaccurate frequency reference from one measurement period to the next, as is inherently the case with measuring precession frequencies of gyromagnetic isotopes, such as in typical NMR gyro systems. In addition, the calculation of the rotation angle $\theta_G$ about the sensitive axis 51 instead of a rotation frequency can reduce processing time and resources based on alleviating the need for post-processing of rotation rate, which can also depend on the stability of an associated frequency reference.

It is to be understood that the NMR gyro system 50 is not limited to the example of FIG. 2. Specifically, the NMR gyro system 50 is demonstrated simplistically, in that additional components can be included in the angular rotation sensor 26, such as to measure the rotation angles $\theta_A$, $\theta_B$, and $\theta_C$ of the gyromagnetic isotopes 16, 18, and 20. As an example, the angular rotation sensor 26 can also include a magnetic field generator that provides an additional magnetic field transverse to the sensitive axis 51 to cooperate with the optical pump beam $O_{PMP}$ in aligning the alkali metal particles 14 to the gyromagnetic isotopes 16, 18, and 20. Furthermore, the NMR gyro system 50 can include other arrangements of the optical signal sources. As an example, the optical pump beam OPMP can also be implemented to generate the optical detection signal $O_{DET}$, such as based on the optical pump beam $O_{PMP}$ being implemented as a single collimated beam that is provided to the NMR gyro cell at a specific angle (e.g., 45° relative to the rotational axis). Thus, the single collimated beam can result in separate normal components within the NMR gyro cell 12 that both pump the alkali metal 14 and generate the optical detection beam $O_{DET}$. Accordingly, the NMR gyro system 50 can be configured in any of a variety of ways.

Figure 3:
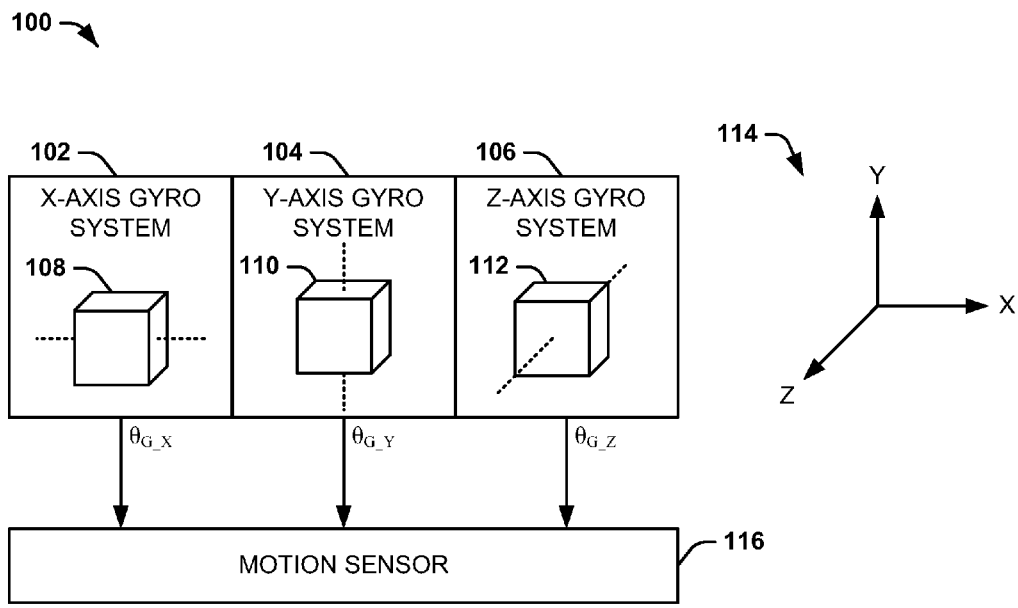
FIG. 3 illustrates an example of a three-axis gyro system in accordance with an aspect of the invention.

FIG. 3 illustrates an example of a three-axis gyro system 100 in accordance with an aspect of the invention. As an example, the three-axis gyro system 100 can be implemented in any of a variety of navigation control systems, such as for aircraft and/or spacecraft, or device to monitor yaw, pitch, and roll rotational motion information.

The three-axis gyro system 100 includes an X-axis gyro system 102, a Y-axis gyro system 104, and a Z-axis gyro system 106. As an example, each of the X-axis, Y-axis, and Z-axis gyro systems 102, 104, and 106 can be configured substantially similar to the NMR gyro system 50 in the example of FIG. 2. In the example of FIG. 3, the X-axis gyro system 102 can have a sensitive axis about the X-axis, the Y-axis gyro system 104 can have a sensitive axis about the Y-axis, and the Z-axis gyro system 106 can have a sensitive axis about the Z-axis. The axes of rotation of the respective NMR gyro cells 108, 110, and 112 are indicated in the example of FIG. 3 by a Cartesian coordinate system 114. Thus, each of X-axis, Y-axis, and Z-axis gyro systems 102, 104, and 106 can be configured to measure two of three gyromagnetic isotopes relative to the slowest precessing gyromagnetic isotope and to calculate the respective rotation angles $\theta_{G\_X}$, $\theta_{G\_Y}$, and $\theta_{G\_Z}$ based on Equation 4. Accordingly, the three-axis gyro system 100 can measure rotational motion about all three of the sensitive axes demonstrated by the X-axis, Y-axis, and Z-axis gyro systems 102, 104, and 106.

In the example of FIG. 3, each of the X-axis, Y-axis, and Z-axis gyro systems 102, 104, and 106 are demonstrated as outputting signals that include the respective rotation angles $\theta_{G\_X}$, $\theta_{G\_Y}$, and $\theta_{G\_Z}$ to a motion sensor 116. The motion sensor 116 can thus be configured to determine an aggregate three-axis rotational motion of the associated vehicle or device that includes the three-axis gyro system 100. Therefore, the yaw, pitch, and roll of the associated vehicle or device that includes the three-axis gyro system 100 can be determined. Accordingly, the motion sensor 116 can be configured to display, output, and/or report the three-axis rotational motion of the associated vehicle or device that includes the three-axis gyro system 100.

Figure 4:
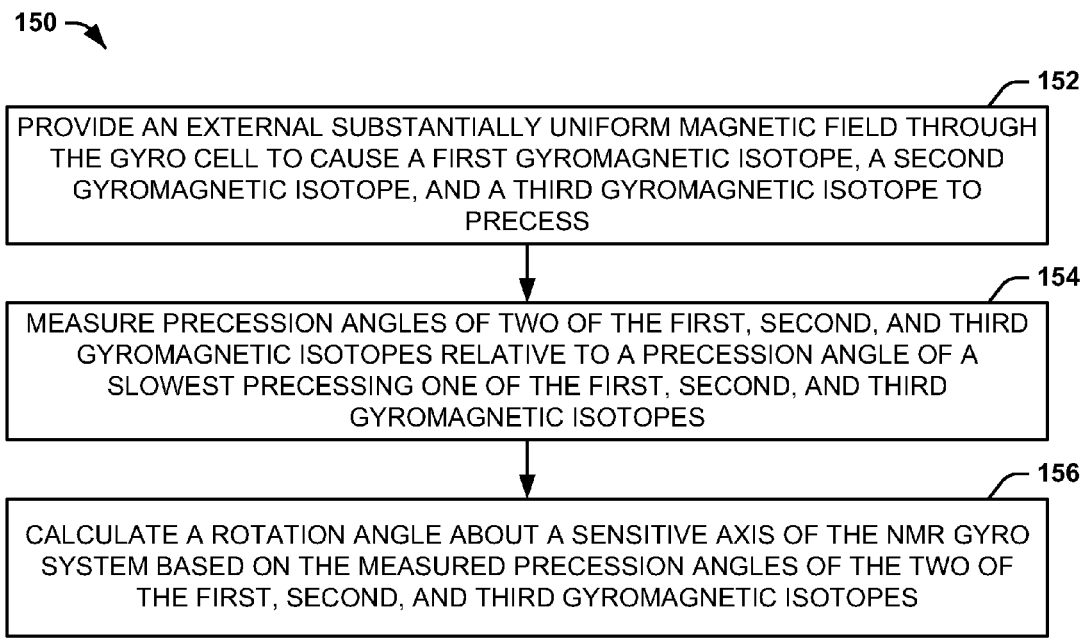
FIG. 4 illustrates an example of a method for determining a rotation angle about a gyro cell in an NMR gyroscope system accordance with an aspect of the invention.

In view of the foregoing structural and functional features described above, a methodology in accordance with various aspects of the present invention will be better appreciated with reference to FIG. 4. While, for purposes of simplicity of explanation, the methodologies of FIG. 4 are shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 4 illustrates an example of a method 150 for determining a rotation angle about a sensitive axis of an NMR gyroscope system accordance with an aspect of the invention. At 152, an external substantially uniform magnetic field is provided through the gyro cell to cause a first gyromagnetic isotope, a second gyromagnetic isotope, and a third gyromagnetic isotope within the gyro cell to precess. The substantially uniform magnetic field can be generated from a magnetic solenoid that substantially surrounds the gyro cell. The first gyromagnetic isotope can precess in a first rotational direction and the other second and third gyromagnetic isotopes can precess in a second, opposite rotational direction.

At 154, precession angles of two of the first, second, and third gyromagnetic isotope are measured relative to a precession angle of a slowest precessing one of the first, second, and third gyromagnetic isotopes. A time duration of a measurement period of the two gyromagnetic isotopes can be set by setting a predetermined precession angle of the slowest precessing one of the gyromagnetic isotopes and measuring rotation of the other two gyromagnetic isotopes within the time duration. The measurement of the rotation angles can be based on counting local oscillator pulses between each measurement pulse of signals corresponding to the frequency of the gyromagnetic isotopes. The measurement pulses can be rising-edge and/or falling-edge zero crossings and/or zero-magnitude first derivatives of the signals.

At 156, a rotation angle about the sensitive axis is calculated based on the measured precession angles of the two of the first, second, and third gyromagnetic isotopes. The rotation angle can be calculated based on a mechanization equation that is derived from individual precession angle equations for each respective gyromagnetic isotopes. The derivation of the mechanization equation can cancel variables of time duration of the measurement period, a magnitude of the substantially uniform magnetic field, and a net local magnetic field resulting from polarization of the alkali metal vapor relative to the first, second, and third gyromagnetic isotopes. The calculated rotation angle about the sensitive axis can thus be independent of the variables.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A nuclear magnetic resonance (NMR) gyroscope system comprising:

a gyro cell that is sealed to enclose an alkali metal vapor, a first gyromagnetic isotope, a second gyromagnetic isotope, and a third gyromagnetic isotope;

a magnetic field generator configured to generate a substantially uniform magnetic field that is provided through the gyro cell to cause the first, second, and third gyromagnetic isotopes to precess; and an angular rotation sensor configured to measure a rotation angle about a sensitive axis of the NMR gyroscope system based on measured precession angles of the first, second, and third gyromagnetic isotopes.

2. The system of claim 1, wherein the angular rotation sensor comprises a mechanization processor configured to implement a mechanization equation to calculate the rotation angle about the sensitive axis independently of a time duration of a measurement period, a magnitude of the substantially uniform magnetic field, and a net local magnetic field resulting from polarization of the alkali metal vapor relative to the first, second, and third gyromagnetic isotopes.

3. The system of claim 2, wherein the mechanization processor is configured to measure a precession angle of two of the first, second, and third gyromagnetic isotopes relative to the remaining one of the first, second, and third gyromagnetic isotopes and to solve a set of three precession angle equations that correspond, respectively, to the first, second, and third gyromagnetic isotopes to cancel the time duration, the magnitude of the substantially uniform magnetic field, and the net local magnetic field from the solution of the rotation angle about the sensitive axis.

4. The system of claim 2, wherein the angular rotation sensor comprises a local oscillator configured to provide a frequency reference during each measurement period for the measurement of the precession angles of the first, second, and third gyromagnetic isotopes, and wherein the mechanization processor is configured to calculate the rotation angle about the sensitive axis independently of an accuracy of the frequency reference from one measurement period to a next measurement period based on the cancellation of the time duration.

5. The system of claim 2, wherein the mechanization processor is configured to calculate the rotation angle $\theta_G$ about the sensitive axis based on the following equation:

$$\theta_G = \theta_A - \gamma Ea * \frac{\theta_A + \theta_B + (\theta_C - \theta_B) * \frac{\gamma_{Pa} + \gamma_{Pb}}{\gamma_{Pa} - \gamma_{Pb}}}{\gamma_{Ea} + \gamma_{Eb} + \frac{\gamma_{Ec} - \gamma_{Eb}}{\gamma_{Pb} - \gamma_{Pc}} * (\gamma_{Pa} + \gamma_{Pb})} +$$

-continued $$\gamma Pa * \left( \frac{(\theta_B - \theta_C)}{\gamma_{Pb} - \gamma_{Pc}} + \frac{\theta_A + \theta_B + (\theta_C - \theta_B) * \frac{\gamma_{Pa} + \gamma_{Pb}}{\gamma_{Pa} - \gamma_{Pb}}}{\gamma_{Ea} + \gamma_{Eb} + \frac{\gamma_{Ec} - \gamma_{Eb}}{\gamma_{Pb} - \gamma_{Pc}} * (\gamma_{Pa} + \gamma_{Pb})} \right) * \frac{\gamma_{Ec} - \gamma_{Eb}}{\gamma_{Pb} - \gamma_{Pc}}$$

where: $\theta_A$, $\theta_B$, and $\theta_C$, are the measured precession angles of the first, second, and third gyromagnetic isotopes, respectively;

γEa, γEb, and γEc are gyromagnetic ratios of each of the first, second, and third gyromagnetic isotopes, respectively; and γPa, γPb, and γPc are magnetic coupling constants of each of the first, second, and third gyromagnetic isotopes, respectively, to the alkali metal vapor.

6. The system of claim 1, wherein the angular rotation sensor is configured to set a duration of a measurement period of the rotation angle about the sensitive axis as a predetermined precession angle magnitude that is precessed by a slowest precessing one of the first, second, and third gyromagnetic isotopes.

7. The system of claim 1, wherein the angular rotation sensor is configured to demodulate and process an optical signal from the gyro cell to generate a set of precession signals having frequencies that correspond, respectively, to precession frequencies of the first, second, and third gyromagnetic isotopes.

8. The system of claim 7, wherein the angular rotation sensor comprises a local oscillator configured to provide a frequency reference for measurement of the precession angle of the first second, and third gyromagnetic isotopes based on the set of precession signals.

9. The system of claim 8, wherein the angular rotation sensor is configured to count a number of pulses of the local oscillator for each measurement pulse of each of the first, second, and third gyromagnetic isotopes to determine the precession angle of two of the first, second, and third gyromagnetic isotopes relative to the remaining one of the first, second, and third gyromagnetic isotopes to calculate the rotation angle about the sensitive axis.

10. A three-axis gyroscope system comprising the NMR gyroscope system of claim 1.

11. A method of determining a rotation angle about a sensitive axis of a nuclear magnetic resonance (NMR) gyroscope system, the method comprising:
   providing an external substantially uniform magnetic field through the gyro cell to cause a first gyromagnetic isotope, a second gyromagnetic isotope, and a third gyromagnetic isotope within the gyro cell to precess;
   measuring precession angles of two of the first, second, and third gyromagnetic isotope relative to a precession angle of a slowest precessing one of the first, second, and third gyromagnetic isotopes;
   calculating a rotation angle about the sensitive axis based on the measured precession angles of the two of the first, second, and third gyromagnetic isotopes.

12. The method of claim 11, wherein calculating the rotation angle comprises implementing a mechanization equation that calculates the rotation angle about the sensitive axis independently of a time duration of a measurement period, a magnitude of the substantially uniform magnetic field, and a net local magnetic field resulting from polarization of the alkali metal vapor relative to the first, second, and third gyromagnetic isotopes.

13. The method of claim 12, further comprising providing a local oscillator frequency reference during each measurement period for the measurement of the precession angles of the first, second, and third gyromagnetic isotopes, and wherein calculating the rotation angle further comprises calculating the rotation angle about the sensitive axis independently of an accuracy of the local oscillator frequency reference from one measurement period to a next measurement period based on the cancellation of the time duration.

14. The method of claim 11, wherein measuring the precession angles comprises setting a time duration of a measurement period for measuring the precession angles equal to a predetermined precession angle that is precessed by the slowest precessing one of the first, second, and third gyromagnetic isotopes.

15. The method of claim 11, further comprising demodulating and processing an optical signal from the gyro cell to generate a set of precession signals that each have a frequency of measurement pulses that correspond, respectively, to precession frequencies of the first, second, and third gyromagnetic isotopes.

16. The method of claim 15, wherein measuring the precession angles further counting local oscillator pulses between each measurement pulse of each of the first, second, and third gyromagnetic isotopes to determine the precession angle of two of the first, second, and third gyromagnetic isotopes relative to a slowest precessing one of the first, second, and third gyromagnetic isotopes to calculate the rotation angle about the sensitive axis.

17. The method of claim 15, wherein demodulating and processing the optical signal comprises demodulating and processing the optical signal from the gyro cell to generate a set of precession signals that each have a function, and wherein the measurement pulses comprise at least one of positive zero-crossings, negative zero-crossings, and first derivatives of each of the respective function precession signals.

18. A nuclear magnetic resonance (NMR) gyroscope system comprising:
   means for generating a substantially uniform magnetic field that is provided through a sealed gyro cell to cause a first gyromagnetic isotope, a second gyromagnetic isotope, and a third gyromagnetic isotope to precess;
   means for measuring precession angles of the first, second, and third gyromagnetic isotopes; and
   means for calculating a rotation angle about a sensitive axis of the NMR gyroscope system independently of a time duration of a measurement period, a magnitude of the substantially uniform magnetic field, and a net local magnetic field resulting from polarization of the alkali metal vapor relative to the first, second, and third gyromagnetic isotopes based on the measured precession angles.

19. The system of claim 18, wherein the means for measuring the precession angles is configured to set a duration of a measurement period of the rotation angle about the sensitive axis as a predetermined precession angle magnitude that is precessed by a slowest precessing one of the first, second, and third gyromagnetic isotopes.

20. The system of claim 18, wherein the means for calculating is configured to solve a set of three precession angle equations that correspond, respectively, to the first, second, and third gyromagnetic isotopes to cancel the time duration, the magnitude of the substantially uniform magnetic field, and the net local magnetic field from the solution of the rotation angle about the sensitive axis.

* * * * *